(12) United States Patent
Ventzek et al.

(10) Patent No.: US 11,056,347 B2
(45) Date of Patent: Jul. 6, 2021

(54) METHOD FOR DRY ETCHING COMPOUND MATERIALS

(71) Applicant: Tokyo Electron Limited, Tokyo (JP)

(72) Inventors: Peter Ventzek, Austin, TX (US); Alok Ranjan, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/847,257

(22) Filed: Apr. 13, 2020

(65) Prior Publication Data

US 2020/0381261 A1 Dec. 3, 2020

Related U.S. Application Data

(60) Provisional application No. 62/853,458, filed on May 28, 2019.

(51) Int. Cl.
*H01L 21/306* (2006.01)
*H01L 21/02* (2006.01)
(Continued)

(52) U.S. Cl.
CPC .. *H01L 21/30621* (2013.01); *H01L 21/02046* (2013.01); *H01L 21/02538* (2013.01); *H01L 21/3065* (2013.01); *H01L 21/31116* (2013.01); *H01L 21/3245* (2013.01); *Y10S 148/056* (2013.01)

(58) Field of Classification Search
None
See application file for complete search history.

(56) References Cited

U.S. PATENT DOCUMENTS

| 5,275,687 A | * | 1/1994 | Choquette | C30B 33/00 117/98 |
| 2007/0134926 A1 | * | 6/2007 | Kwon | H01S 5/183 438/707 |

(Continued)

FOREIGN PATENT DOCUMENTS

JP 20172285580 A 12/2017

OTHER PUBLICATIONS

G.S. Oehrlein et al., "Atomic Layer Etching at the Tipping Point:; An Overview", ECS Journal of Solid State Science and Technology, vol. 4, pp. N5041-N5053. (Year: 2015).*

(Continued)

*Primary Examiner* — Jiong-Ping Lu
(74) *Attorney, Agent, or Firm* — Slater Matsil, LLP

(57) ABSTRACT

A method for treating a substrate includes receiving a substrate in a vacuum process chamber. The substrate includes a III-V film layer disposed on the substrate. The III-V film layer includes an exposed surface, an interior portion underlying the exposed surface, and one or more of the following: Al, Ga, In, N, P, As, Sb, Si, or Ge. The method further includes altering the chemical composition of the exposed surface and a fraction of the interior portion of the III-V film layer to form an altered portion of the III-V film layer using a hydrogen-based plasma treatment, removing the altered portion of the III-V film layer using a chlorine-based plasma treatment, and repeating the altering and removing of the III-V film layer until a predetermined amount of the III-V film layer is removed from the substrate.

22 Claims, 9 Drawing Sheets

(51) Int. Cl.
*H01L 21/3065* (2006.01)
*H01L 21/324* (2006.01)
*H01L 21/311* (2006.01)

(56) References Cited

U.S. PATENT DOCUMENTS

| | | |
|---|---|---|
| 2016/0192502 A1 | 6/2016 | Tolle et al. |
| 2017/0018439 A1 | 1/2017 | Wang et al. |
| 2017/0110327 A1 | 4/2017 | Kim et al. |
| 2017/0365465 A1 | 12/2017 | Okada |
| 2018/0174963 A1 | 6/2018 | Chen et al. |

OTHER PUBLICATIONS

Bae, J.W., et al., "Anisotropic Etching of InP and InGaAs by Using an Inductively Coupled Plasma in Cl2/N2 and Cl2/Ar Mixtures at Low Bias Power," Journal of the Korean Physical Society, vol. 50, No. 4, Apr. 2007, pp. 1130-1135.

Del Alamo, Jesus A., et al, "Nanometer-Scale III-V MOSFETs, Journal of the Electron Devices Society," 2016 IEEE, 10 pages.

Gu, J.J., et al., "First Experimental Demonstration of Gate-all-around III-V MOSFETs by Top-down Approach," 2011 International Electron Devices Meeting, IEEE, 2011, 4 pages.

Gu, J.J., et al., "III-V Gate-all-around Nanowire MOSFET Process Technology: From 3D to 4D," 2012 International Electron Devices Meeting, IEEE, 2012, 4 pages.

Lin, Jianqiang, et al., "A Novel Digital Etch Technique for Deeply Scaled III-V MOSFETs," IEEE Electron Device Letters, vol. 35, No. 4, Apr. 2014, 3 pages.

S. Miyakuni, et al., "Low damage etching of InGaAs/AlGaAs by the electron cyclotron resonance plasma with Cl2/He mixture for heterojunction bipolar transistors," American Institute of Physics, J. Vac. Sci. Technol. B 12(2), Mar./Apr. 1994, 7 pages.

Sherpa, Sonam D. et al, "Quasi-atomic layer etching of silicon nitride," J. Vac. Science Technology. A, vol. 35, No. 1, Jan./Feb. 2017, 7 pages.

Takagi, Shinichi, et al., IOP Science, "11☆ V/Ge channel MOS device technologies in nano CMOS era," Japanese Journal of Applied Physics 54, 06FA01 (2015), 19 pages.

Yeom, Geun Young, "Atomic Layer Etching: Application to Nanoelectronic Device Processing," Oct. 15, 2013, The Tenth U.S.-Korea Forum on Nanotechnology, 31 pages.

\* cited by examiner

METHOD FOR DRY ETCHING COMPOUND MATERIALS

This application claims priority to U.S. Provisional Application No. 62/853,458, filed on May 28, 2019, which application is hereby incorporated by reference in its entirety.

TECHNICAL FIELD

The present invention relates generally to methods of dry etching, and, in particular embodiments, to methods for the dry etching of compound materials and to systems and structures formed and utilized therein.

BACKGROUND

There is a continuous effort in the world of integrated circuit manufacturing to increase device density in order to improve speed, performance and costs. In order for the semiconductor industry to continue scaling to smaller node sizes, device architectures have evolved from two-dimensional (2D) planar structures to also include one-dimensional (1D) and three-dimensional (3D) structures. Technology needed to produce desirable 1D, 2D, 3D structures such as nanowires, nanosheets, fin field-effect transistors (FinFETs), gate-all-around (GAA) devices, and vertically oriented transistors is in varying stages of development. For example, many of the processes used to produce complicated structures in a laboratory or prototyping setting do not translate to high-volume manufacturing (HVM).

Compound materials utilizing two or more elements from groups III and V of the periodic table may have desirable characteristics for use in devices as process nodes get smaller and smaller. The fabrication of complicated 1D, 2D, and 3D structures may present etch challenges where both anisotropic and isotropic etch processes are beneficial. However, compound materials may be difficult to etch because of the differences in the volatility of each constituent element. Therefore, methods of etching compound materials with high precision that are capable of integration with HVM process flows may be desirable.

SUMMARY

In accordance with an embodiment of the invention, a method for treating a substrate includes receiving a substrate in a vacuum process chamber. The substrate includes a III-V film layer disposed on the substrate. The III-V film layer includes an exposed surface, an interior portion underlying the exposed surface, and one or more of the following: Al, Ga, In, N, P, As, Sb, Si, or Ge. The method further includes altering the chemical composition of the exposed surface and a fraction of the interior portion of the III-V film layer to form an altered portion of the III-V film layer using a hydrogen-based plasma treatment, removing the altered portion of the III-V film layer using a chlorine-based plasma treatment, and repeating the altering and removing of the III-V film layer until a predetermined amount of the III-V film layer is removed from the substrate.

In accordance with another embodiment of the invention, a method for treating a substrate includes receiving a substrate in a vacuum process chamber. The substrate includes a III-V film layer disposed on the substrate. The III-V film layer includes an exposed surface, an interior portion underlying the exposed surface, and one or more of the following: Al, Ga, In, N, P, As, Sb, Si, or Ge. The method further includes treating the exposed surface using a chlorine-based plasma pre-treatment to form a passivation layer on the exposed surface, treating the substrate with a hydrogen-based plasma treatment to form a hydrogen interface layer between the passivation layer and the interior portion, removing the passivation layer and the hydrogen interface layer, using a chlorine-based plasma treatment, to expose the interior portion, and repeating the treating of the exposed surface, the treating of the substrate, and the removing of the passivation layer and the hydrogen interface layer until a predetermined amount of the III-V film layer is removed from the substrate.

In accordance with still another embodiment of the invention, a method for treating a substrate includes receiving a substrate in a vacuum process chamber. The substrate includes a III-V film layer disposed on the substrate. The III-V film layer includes an exposed surface, an interior portion underlying the exposed surface, and one or more of the following: Al, Ga, In, N, P, As, Sb, Si, or Ge. The method further includes altering the chemical composition of the exposed surface and a fraction of the interior portion of the III-V film layer to form an altered portion of the III-V film layer using a hydrogen-based plasma treatment, removing the altered portion of the III-V film layer using a halogen-based plasma treatment, purging the vacuum process chamber of halogen-based chemistry from the halogen-based plasma treatment, and repeating the altering of the chemical composition of the exposed surface, the removing of the altered portion of the III-V film layer, and the purging the vacuum process chamber of the halogen-based chemistry until a predetermined amount of the III-V film layer is removed from the substrate.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
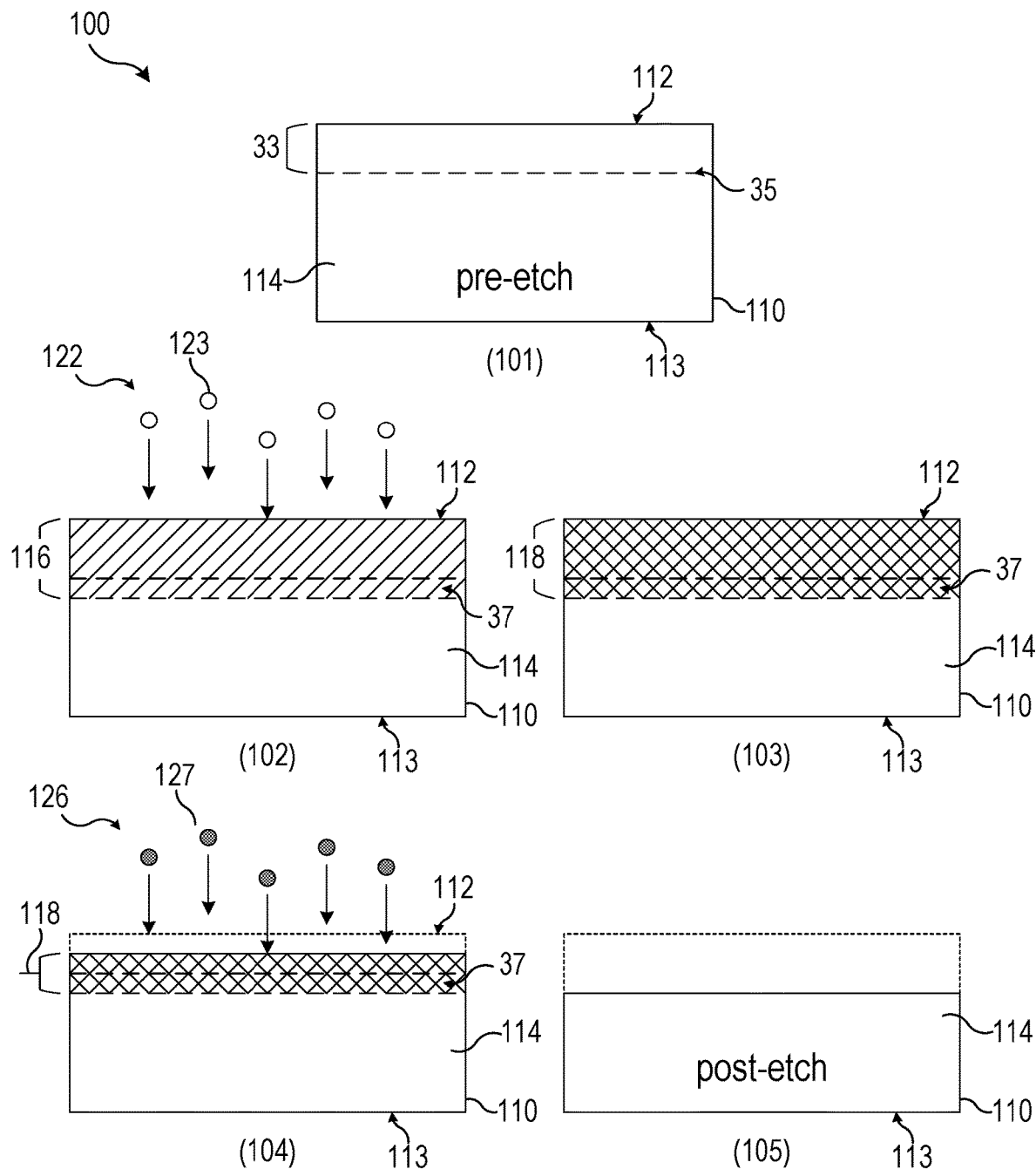
FIG. 1 illustrates an example process of treating a substrate using a hydrogen-based plasma treatment and a halogen-based plasma treatment in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Many materials being considered as new channel materials for current and future process nodes (e.g. 3 nm) are compound materials. In particular, a variety of III-V compounds are being considered. For example, indium gallium arsenide (InGaAs) and other materials based on In, Ga, or As may be desirable as channel materials because of high electron mobility as well as for other characteristics.

However, the constituent elements of the compound materials are not equally volatile (e.g. to the same precursor at the same temperature) which results in different relative capabilities of removal from a substrate during etching. The boiling point of an etch product can be a good indicator of the etch product's volatility. The boiling points of the etch products of In, Ga, and As using halogens such as fluorine (F) and chlorine (Cl) vary widely ranging from −623° C. for $AsF_2$ to 201° C. for $GaCl_2$ and etch products like $InCl_2$ and $InF_2$ are practically nonvolatile. Increased temperature is often not an acceptable solution as temperatures above around 100° C. are unsuitable for process integration. Consequently, precise and clean etching of compounds may be difficult.

Several methods have been used (e.g. in laboratories or in small batch processing) to etch compound materials such as InGaAs. For example, methane ($CH_4$) chemistries may be used (e.g. for the nonvolatile In species), but have the disadvantage of generating particles that deposit on the substrate. Oxidation followed by wet removal is also possible, but is not HVM compatible. Further, silicon (Si) and boron (B) compounds may be utilized or sidewalls may be passivated to achieve profile control, but these carry an undesirable well-known risk of residues.

Hydrogen may be used as an etchant for GaAs and InGaAs, but may disadvantageously require a low radio frequency (RF) bias, large hydrogen flux and may be highly sensitive to crystalline defects. Since hydrogen has increased reactivity with certain bonds, any defects in the crystal structure can cause surface irregularities such as pitting. Other methods combining $O_2$ with $Cl_2$, $Cl_2/N_2$, or $CH_4/H_2$ may also be used. Yet these methods may rely on sidewall passivation to achieve verticality and a large RF bias making them incapable of damage-free processing. Methods that combine halogen etchants with passivation schemes may be generally inflexible (e.g. anisotropic cannot be easily made isotropic, etc.).

In various embodiments, a method for treating a substrate resolving some or all of these disadvantages includes altering the chemical composition of an exposed surface of a compound material of the substrate and a fraction of an interior portion of the compound material using a hydrogen-based plasma treatment. The compound material may be a III-V film layer, for example, including one or more of the elements In, Ga, As, aluminum (Al), nitrogen (N), phosphorous (P), or antimony (Sb), in addition to others such as germanium (Ge) and silicon (Si). The method further includes removing the altered portion of the compound material using a halogen-based plasma treatment. These two steps may be repeated until a predetermined amount of the compound material is removed from the substrate.

The embodiment methods described herein may have the advantage of allowing treatment of compound materials including one or more of In, Ga, As, Al, N, P, Sb, Ge, and Si while maintaining compatibility with HVM processes. These methods may advantageously be dry methods of treating a substrate (i.e. substrate treatments that do not expose the substrate to a liquid). That is, the embodiment methods described herein may advantageously be "all dry" processes that can manage III-V etching complexities. For example, the embodiment methods described herein may advantageously be usable in semiconductor device fabrication, such as during front-end-of-line (FEOL), middle-end-of-line (MEOL), logic fabrication, memory fabrication (e.g. NAND memory).

The hydrogen-based plasma treatment of the embodiment methods described herein may advantageously use hydrogen to weaken bonds. For example, hydrogen may chemically interact with a compound material (e.g. GaAs, InGaAs, etc.) and draw away electrons advantageously weakening the lattice. Further, this general process may be advantageously used to tune how a topographic surface is exposed.

Another possible benefit of the hydrogen-based plasma treatment is to enable directional control during treatment of a substrate. For example, pressure during the hydrogen-based plasma treatment may be controlled to advantageously facilitate a desired directionality for a substrate treatment ranging from anisotropic to isotropic. The halogen-based plasma treatment may then beneficially maintain the desired directionality.

A possible advantage of the control over directionality is to enable the halogen-based plasma treatment to etch the compound material isotropically, anisotropically, or to any degree therebetween. The flexibility of the etching processes using the hydrogen-based plasma treatment and the halogen-based plasma treatment may advantageously be used to perform substantially anisotropic and substantially isotropic etches using the same chemistry. Additionally, the etching processes using the hydrogen-based plasma treatment and the halogen-based plasma treatment may advantageously decrease the power and/or flux requirements when compared to conventional etching processes.

Additionally, the embodiment methods described herein may have the benefit of being usable to form complex 1D, 2D, and 3D structures. For example, substantially isotropic etches using the hydrogen-based plasma treatment and the halogen-based plasma treatment may advantageously undercut structures. Similarly, substantially anisotropic etches using the hydrogen-based plasma treatment and the halogen-based plasma treatment may advantageously from recessed regions without sidewall passivation. Substantially isotropic and substantially anisotropic etches may be used separately or in combination to form nanowires, nanosheets, GAA devices, and other complex structures.

Figure 8:
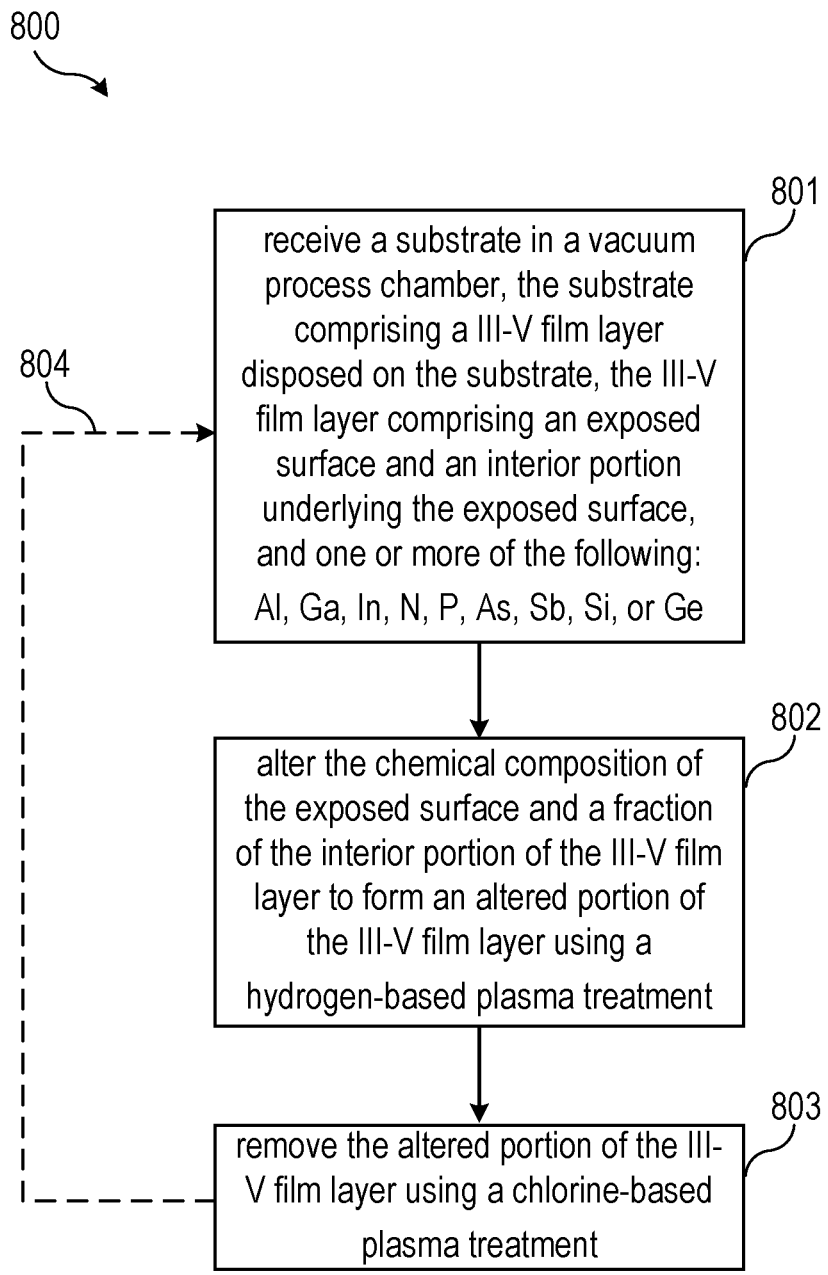
FIG. 8 illustrates an example method including a process of treating a substrate in accordance with an embodiment of the invention.
Figure 9:
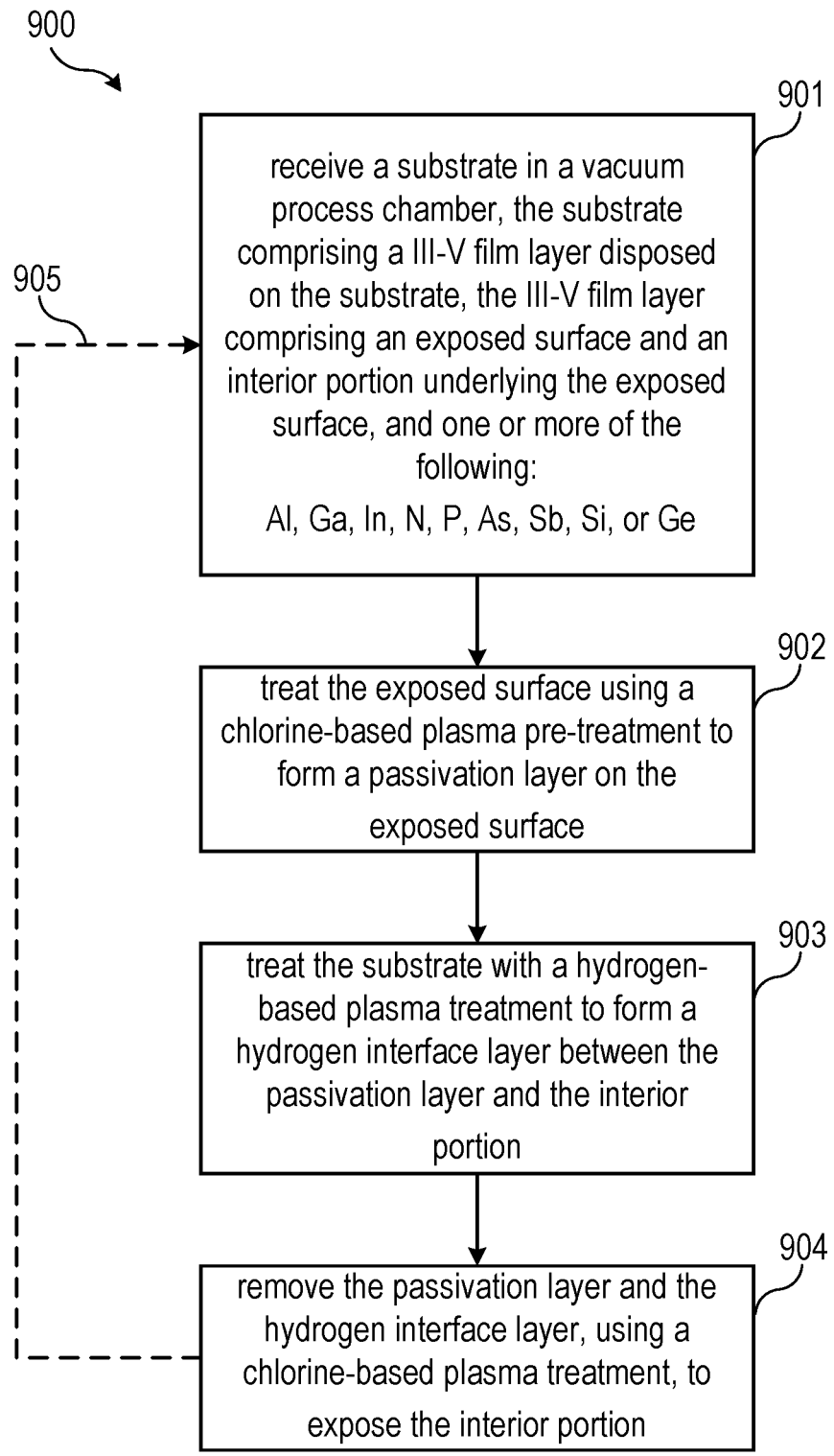
FIG. 9 illustrates another example method including a process of treating a substrate in accordance with an embodiment of the invention.
Figure 10:
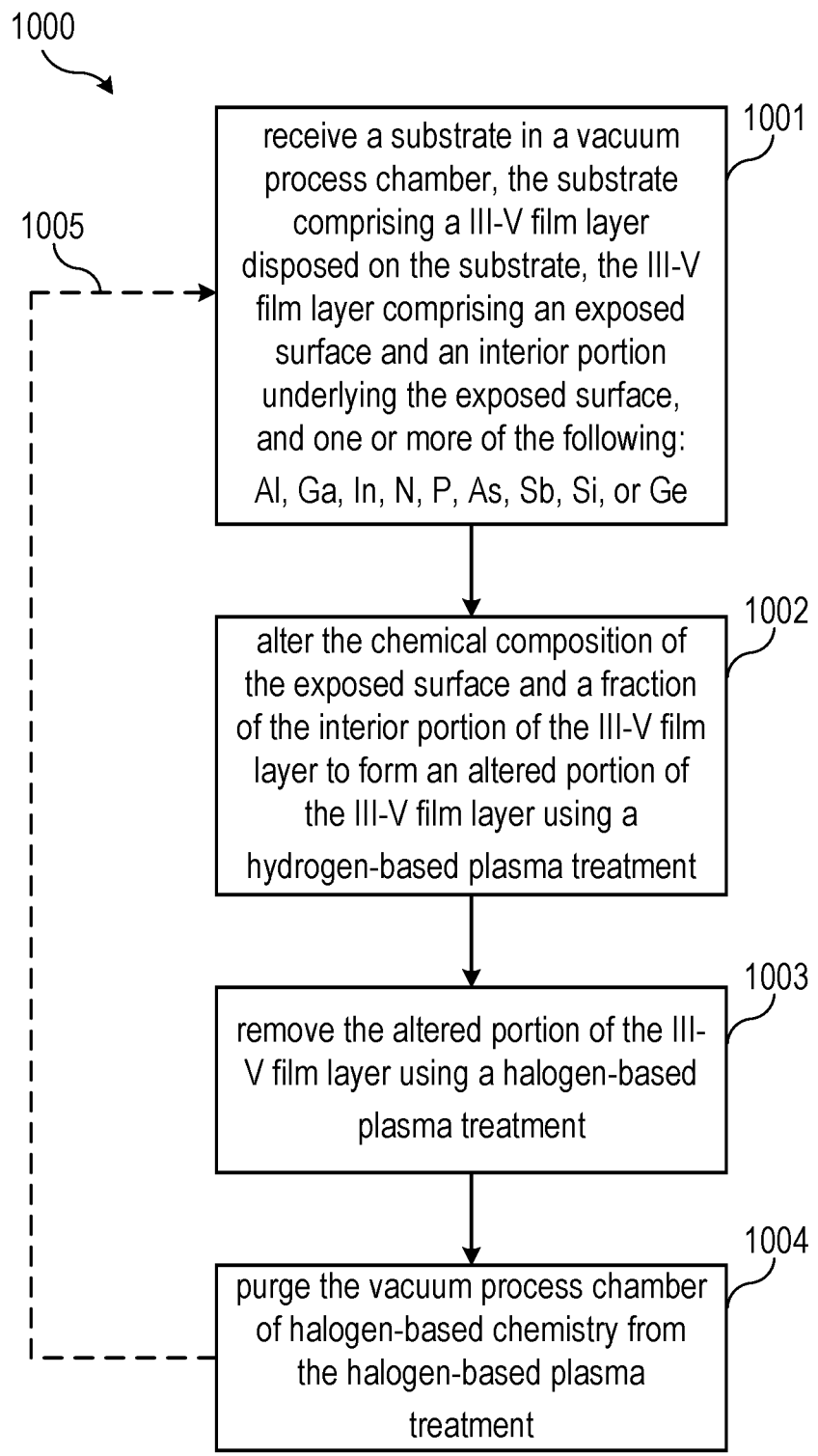
FIG. 10 illustrates still another example method including a process of treating a substrate in accordance with an embodiment of the invention.

Embodiments provided below describe various methods of dry etching, and, in particular embodiments, describe various methods for the dry etching of compound materials and systems and structures utilized therein. The following description describes the embodiments. Three embodiment processes of treating a substrate are described using FIGS. 1-3. Two schematic timing diagrams are described using FIGS. 4 and 5. An embodiment system for plasma processing is described using FIG. 6 while FIGS. 8-10 are used to describe three methods including processes of treating a substrate.

FIG. 1 illustrates an example process of treating a substrate using a hydrogen-based plasma treatment and a halogen-based plasma treatment in accordance with an embodiment of the invention.

Referring to FIG. 1, a compound material no including an exposed surface 112 and a bottom surface 113 is shown at an initial stage 101 of a process 100 of treating a substrate. The compound material no is included on or within the substrate treated by the process 100. The process 100 is an etch process in one embodiment. The initial stage 101 may be referred to as the pre-etch stage as shown. The compound material no also includes an interior portion 114 between the exposed surface 112 and the bottom surface 113. In one embodiment, the bottom surface 113 abuts a bulk portion of the substrate and is not exposed. Alternatively, all or some of the bottom surface 113 may also be exposed (e.g. if the compound material no is the entire substrate).

The compound material no may include two or more elements from group III (also referred to as "IIIA", "13", and "boron group") and group V (also referred to as "VA", "15", "nitrogen family", and "pnictogens") of the periodic table in various embodiments. The compound material no may also include additional elements not in group III or group V. For example, Si, Ge, and others may also be included in the compound material no. The compound material no is a III-V material in various embodiments and is a III-V film layer in some embodiments. Alternatively the compound material no may also be a III-V wafer. In some embodiments, the compound material no includes Ga and As. In one embodiment, the compound material is InGaAs. For example, the chemical formula for InGaAs may be written $In_xGa_{1-x}As$ where x is a real number between 0 and 1 (e.g. $In_{0.47}Ga_{0.53}As$). The compound material no may advantageously have high electron (or hole) mobility (e.g. useful as a channel material).

The definition of "III-V" as used herein is broad and intended to encompass materials that include at least one group III element and at least one group V element. For example, binary crystalline compounds including a group III element and a group V element (e.g. GaAs, InP, InAs, GaSb, InSb, etc.) are III-V materials in the context of this disclosure. Additionally, ternary (or higher) alloys that include at least one group III element and at least one group V element (e.g. InGaAs, GaAsN, GaAsP, InGaAsSb, etc.) are also III-V materials in the context of this disclosure.

The compound material no is illustrated during a hydrogen treatment phase 102 in which the exposed surface 112 is exposed to a hydrogen-based plasma treatment 122. For example, the hydrogen-based plasma treatment 122 may include hydrogen gas ($H_2$) plus an inert gas such as Ar. A fraction 116 of the compound material no (e.g. a thin surface layer) is infused with hydrogen during the hydrogen-based plasma treatment 122. The fraction 116 infused with hydrogen includes the exposed surface 112 and some of the interior portion 114.

The hydrogen-based plasma treatment 122 includes hydrogen-based chemistry 123 which may be radicals (e.g. H.) or ions (e.g. H+) or a mixture. For example, the hydrogen-based chemistry 123 may be predominantly hydrogen ions delivered vertically to the exposed surface 112 exposing horizontal surfaces. Alternatively, the hydrogen-based chemistry 123 may be predominantly hydrogen radicals exposing both vertical and horizontal exposed surfaces. Selectivity of the treatment may be affected by additional factors such as temperature. In the specific case of InGaAs, the hydrogen interaction with InGaAs may be controlled by varying the temperature (e.g. less than 0° C. may be desirable for high aspect ratio structures).

A post hydrogen treatment stage 103 is shown in which the fraction 116 of the compound material no has been converted an altered portion 118. That is, the hydrogen-based plasma treatment 122 alters the chemical composition of the exposed surface 112 and the fraction 116 of the compound material 110 to form the altered portion 118. In the specific case of InGaAs, the hydrogen exposure may convert the crystalline InGaAs structure to $InH_xGaH_yAsH_z$ forming a layer where constituent elements are more likely to react with the etchant (e.g. Cl). For example, hydrogen compounds such as arsine, gallane, digallane, indigane, and others may be formed in the altered portion 118. Hydrogen compounds such as these may advantageously weaken the structure of the compound material no.

Hydrogen may be considered a weak etchant of many compound (e.g. III-V) materials. Consequently, a small amount of the compound material no may also be etched away during the hydrogen-based plasma treatment 122 in addition to chemical modification.

The process 100 of treating the substrate continues with a halogen treatment phase 104 in which the exposed surface 112 is exposed to a halogen-based plasma treatment 126. The halogen-based plasma treatment 126 is a chlorine-based plasma treatment in some embodiments. For example, the halogen-based plasma treatment 126 may include chlorine gas ($Cl_2$) plus an inert gas such as Ar. Some or all of the altered portion 118 is removed by halogen-based chemistry 127 that is included in the halogen-based plasma treatment 126 resulting in a post-etch stage 105. The halogen-based chemistry 127 includes halogen species (e.g. F, Cl, Br) and may include halogen radicals (e.g. F., Cl., Br.) or halogen ions (e.g. F⁻, Cl⁻, Br⁻) or both. In some applications (e.g. front end processes) chlorine may be advantageous because of improved process compatibility.

In some cases the halogen-based plasma treatment 126 may be substituted with a different type of plasma treatment. For example, methane ($CH_4$) may be used as an etchant during the treatment phase 1434 in some embodiments. Alternative treatment options may still preferentially etch the altered portion 118.

The halogen-based chemistry 127 may advantageously remove all of the elements of the compound material no at substantially the same rate resulting in a smooth etched surface. Further, the halogen-based plasma treatment 126 may be selective to the altered portion 118 of the compound material allowing improved control over the etching process. A potential benefit of the selectivity of the halogen-based plasma treatment 126 is to allow flexibility between anisotropic and isotropic treatments based on the relative exposure of horizontal and vertical surfaces to hydrogen during the hydrogen-based plasma treatment 122.

The process 100 of treating the substrate may be performed cyclically. That is, the post-etch stage 105 may become an initial stage for another iteration of the hydrogen treatment phase 102 and the halogen treatment phase 104. In this way, a precise amount of the compound material no may be advantageously removed.

An optional halogen-based plasma pre-treatment may be performed before the hydrogen treatment phase 102 as shown in the initial stage 101. For example, the halogen-based plasma pre-treatment may be similar to the halogen-based plasma treatment 126. An optional passivation layer 33 is formed by exposing an optional exposed surface 35 of the compound material 110 to the optional halogen-based plasma pre-treatment. The top surface of the optional passivation layer 33 then functions as the exposed surface 112 for the remainder of the process 100 as shown.

When the optional halogen-based plasma pre-treatment is included in the process 100, the compound material 110 includes the optional passivation layer 33 formed on the optional exposed surface 35 during the hydrogen treatment phase 102. The exposed surface 112 of the optional passivation layer 33 is exposed to the hydrogen-based plasma treatment 122. An optional hydrogen interface layer 37 is formed by the hydrogen-based plasma treatment 122. It should be noted that the process 100 of treating the substrate including the optional halogen-based plasma pre-treatment may also be performed cyclically, but may include the optional halogen-based plasma pre-treatment in every cycle.

When hydrogen is applied to the optional passivation layer 33, hydrogen species may diffuse into the optional passivation layer 33 and into the compound material 110 forming the optional hydrogen interface layer 37. Hydrogen in the optional hydrogen interface layer 37 may interact with defects in the compound material 110 advantageously resulting in improved surface qualities of the etched surface (e.g. smoothness, uniformity, etc.) in the post-etch stage 105. In other words, the hydrogen may "fill in" defects prior to the etching process reducing or eliminating defect formation from etch products.

In some cases, plasma damage may need to be addressed. For example, high energy ions may cause damage during plasma treatments. Wet etching techniques can achieve smooth topography without damaging underlying epitaxially grown films (e.g. HF+KMnO$_x$), but at the cost of being unable to liberate some etch products (e.g. indium etch products such as InCH$_x$ and InCl$_x$). Low energy ions (e.g. <20 V) may be sufficient for indium containing compound materials under certain conditions. For these cases, InCl may be formed and low pressure may mitigate redeposition.

The hydrogen-based plasma treatment may improve the process by raising the etch rate, allowing for higher pressure, and preventing defect formation. As an example, when the optional halogen-based plasma pre-treatment is included to form the optional passivation layer 33, all treatment steps may be performed at high pressure (e.g. >100 mTorr) with zero or low bias. Specifically, the optional halogen-based plasma pre-treatment and the hydrogen-based plasma treatment 122 may be performed with zero bias (e.g. radical driven) while the halogen-based plasma treatment 126 may be performed with low bias.

Figure 2:
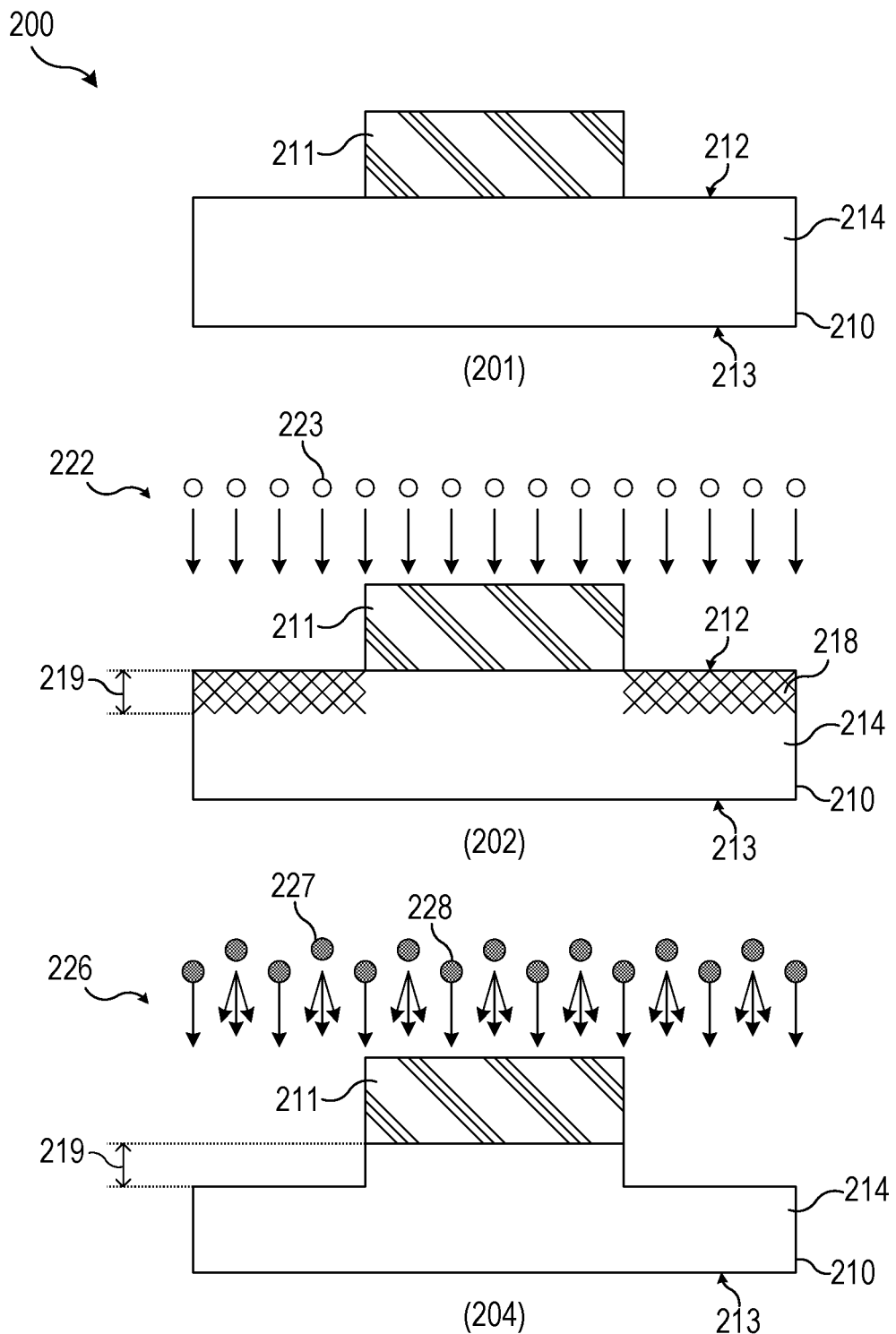
FIG. 2 illustrates an example process of treating a substrate including a substantially anisotropic etching process in accordance with an embodiment of the invention.

FIG. 2 illustrates an example process of treating a substrate including a substantially anisotropic etching process in accordance with an embodiment of the invention. The process of FIG. 2 may be a specific implementation of other processes described herein such as the process of FIG. 1, for example. Similarly labeled elements may be as previously described.

Referring to FIG. 2, a compound material 210 including an exposed surface 212, an interior portion 214, and a bottom surface 213 is shown at an initial stage 201 of a process 200 of treating a substrate. A mask layer 211 is disposed on the exposed surface 212. It should be noted that here and in the following a convention has been adopted for brevity and clarity wherein elements adhering to the pattern x10 may be related implementations of a compound material in various embodiments. An analogous convention has also been adopted for other elements as made clear by the use of similar terms in conjunction with the aforementioned three-digit numbering system.

The compound material 210 is illustrated during a hydrogen treatment phase 202 in which the exposed surface 212 is exposed to a hydrogen-based plasma treatment 222 which is performed at low pressure. In various embodiments, the hydrogen-based plasma treatment 222 is performed at a pressure less than about 30 mTorr and at a pressure between about 3 mTorr and about 30 mTorr in some embodiments. Due to the low pressure, the hydrogen-based plasma treatment 222 predominantly includes hydrogen ions 223. The hydrogen ions 223 (e.g. H$^+$) may advantageously include a non-negligible directionality (e.g. vertical) that facilitates preferential exposure of horizontal surfaces of the exposed surface 212.

The mask layer 211 shields the compound material 210 and enables a pattern of exposure of the hydrogen ions 223. An altered portion 218 is formed from the exposed surface 212 and a fraction of the interior portion 214. The altered portion 218 has an altered portion thickness 219 that may depend on diffusivity of the hydrogen. In various embodiments, the altered portion thickness 219 is less than about 5 nm and is between about 1 nm and about 3 nm in some embodiments. For example, the altered portion thickness 219 may be equal to the thickness of a monolayer or a few atomic layers of the compound material 210.

Still referring to FIG. 2, the compound material 210 then illustrated during a halogen treatment phase 204 in which the exposed surface 212 is exposed to a halogen-based plasma treatment 226. The halogen-based plasma treatment 226 may also be performed at low pressure, but may also be performed at higher temperatures. In various embodiments, the halogen-based plasma treatment 226 is performed at a pressure that is less than about 30 mTorr and between about 3 mTorr and about 30 mTorr in some embodiments. Alternatively, the halogen-based plasma treatment 226 may be performed at a pressure greater than 30 mTorr.

The halogen-based plasma treatment 226 removes all or some of the altered portion 218 as shown. The halogen-based plasma treatment 226 includes halogen-based radicals 227 (e.g. Cl.) and/or halogen-based ions 228 (e.g. Cl$^-$). In one embodiment, the halogen-based plasma treatment 226 is a chlorine-based plasma treatment. Other suitable methods of delivering halogen-based radicals and/or halogen-based ions may also be used.

Due to the directionality of the hydrogen-based plasma treatment 222, the etching process fueled by the halogen-based plasma treatment 226 is advantageously substantially isotropic. That is, the process 200 may preferentially etch horizontal surfaces (i.e. line of sight). For example, non-horizontal surfaces of the compound material 210 may be etched at a far slower rate (e.g. <$_5$%) compared to horizontal surfaces.

The rate and quality of the etching process may depend on the selectivity of the halogen-based plasma treatment 226 to the altered portion 218 relative to the unaltered portion (e.g. remaining interior portion 214) of the compound material 210. The selectivity may also advantageously self-limit the process 200 allowing for precise removal of the compound material. The removed layer may or may not be a single layer. For example, the removed layer may be a few or several layers. The thickness of the removed layer may depend on the penetration depth of the hydrogen during the hydrogen-based plasma treatment 222. The number of modified layers may also be a function of dose (e.g. site density divided by the flux, unity probability of reaction). In addition, the reactivity of the compound material 210 may depend on temperature.

Figure 3:
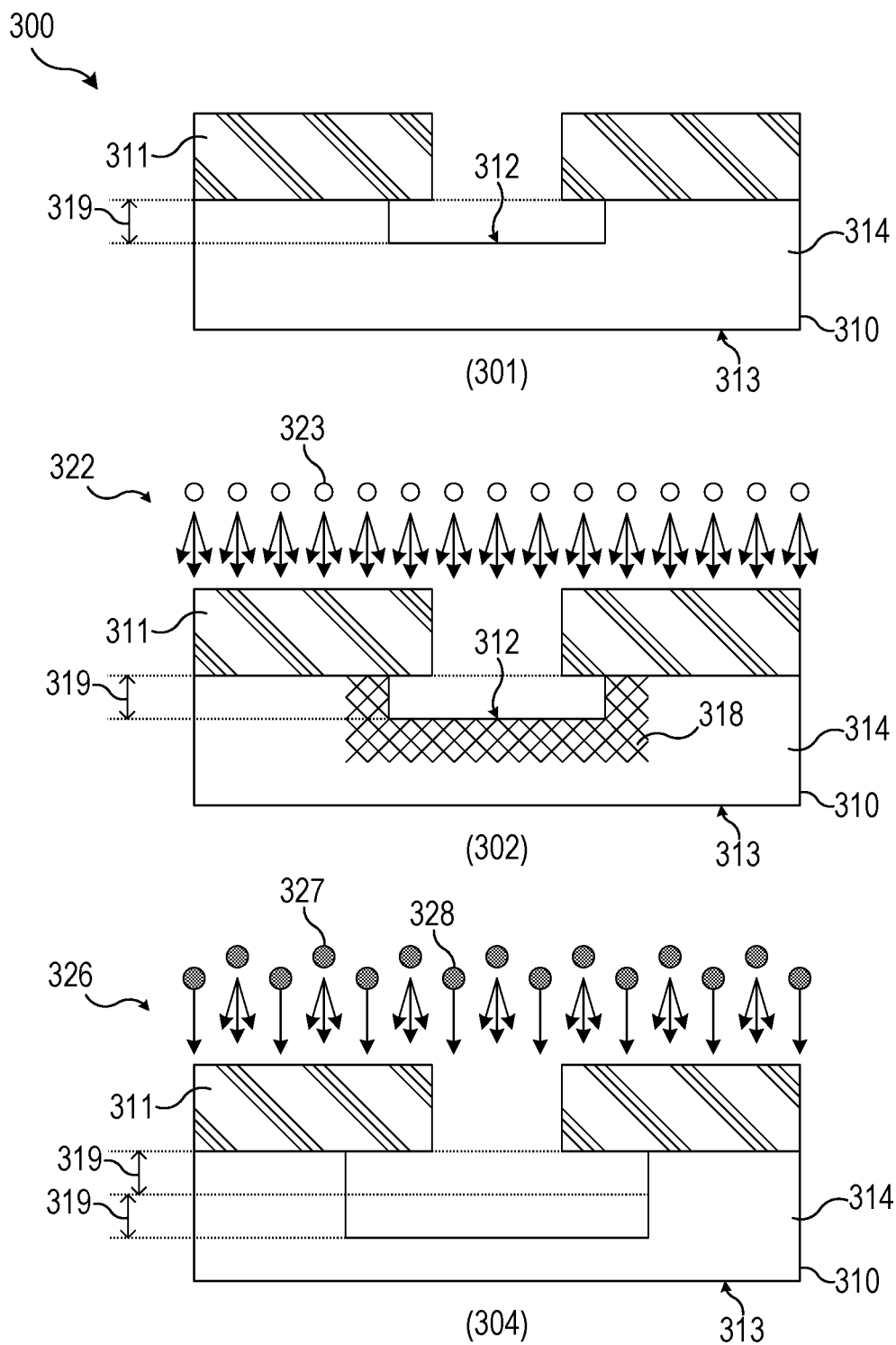
FIG. 3 illustrates an example process of treating a substrate including a substantially isotropic etching process in accordance with an embodiment of the invention.

FIG. 3 illustrates an example process of treating a substrate including a substantially isotropic etching process in accordance with an embodiment of the invention. The process of FIG. 3 may be a specific implementation of other processes described herein such as the process of FIG. 1, for example. Similarly labeled elements may be as previously described.

Referring to FIG. 3, a compound material 310 including an exposed surface 312, an interior portion 314, and a bottom surface 313 is shown at an initial stage 301 of a process 300 of treating a substrate. A mask layer 311 is disposed on the exposed surface 212. In contrast to process 200 of FIG. 2, the process 300 is radical-driven during a hydrogen treatment phase 302 which may advantageously result in substantially isotropic removal of the compound material 310 as shown. The compound material 310 is illustrated as having already had an altered portion thickness 319 removed prior to the initial stage 301.

During a hydrogen treatment phase 302, a hydrogen-based plasma treatment 322 including hydrogen-based radicals 323 (e.g. H.) is applied to the exposed surface 312. For example, the hydrogen-based plasma treatment 322 may be performed under high pressure with low, zero, or reverse bias (e.g. bias that repels hydrogen-based ions). In various embodiments, the hydrogen-based plasma treatment 322 is performed at a pressure greater than about 100 mTorr.

Notably, the non-horizontal surfaces of the compound material 310 are also altered by the hydrogen-based radicals 323 as shown. The lack of directionality afforded by the hydrogen-based plasma treatment 322 may be due to high pressure hydrogen-based radicals that diffuse to exposed surfaces with little or no directionality. Alternatively, non-plasma methods may also be used as hydrogen generators such as a high pressure microwave hydrogen generator (e.g. remote source) which may advantageously result in no hydrogen-based ions. Additionally, other suitable methods may also be employed to deliver hydrogen-based radicals.

Similar to the process 200 of FIG. 2, a halogen-based plasma treatment 326 is then applied to the exposed surface 312 during a halogen treatment phase 304. The resulting removal of the altered portion 318 is advantageously substantially isotropic. For example, the horizontal etching capability afforded by the substantially isotropic etch may advantageously find applicability in fabrication processes involving nanosheets, nanowires, GAA structures, gate etchback, smaller process nodes (e.g. 3 nm), and others.

In various embodiments, the halogen-based plasma treatment 326 is performed at low pressure (e.g. 3-30 mTorr), but may also be performed at higher pressures. Once again, the process 300 may be self-limiting (e.g. the etch rate of the unaltered compound material is very low although nonzero) by virtue of the hydrogen-based modification of the compound material 310 during the hydrogen treatment phase 302.

As previously mentioned the removed layer of compound material 310 may or may not be one layer and may depend on a variety of factors. The halogen-based plasma treatment 326 may utilize a mixed plasma in which the ions have a preferential direction. However, the directional effects of the halogen-based ions 328 may be tuned out by tweaking process parameters advantageously improving the approximation of a truly isotropic etching process or even achieving an effectively isotropic etch.

Figure 4:
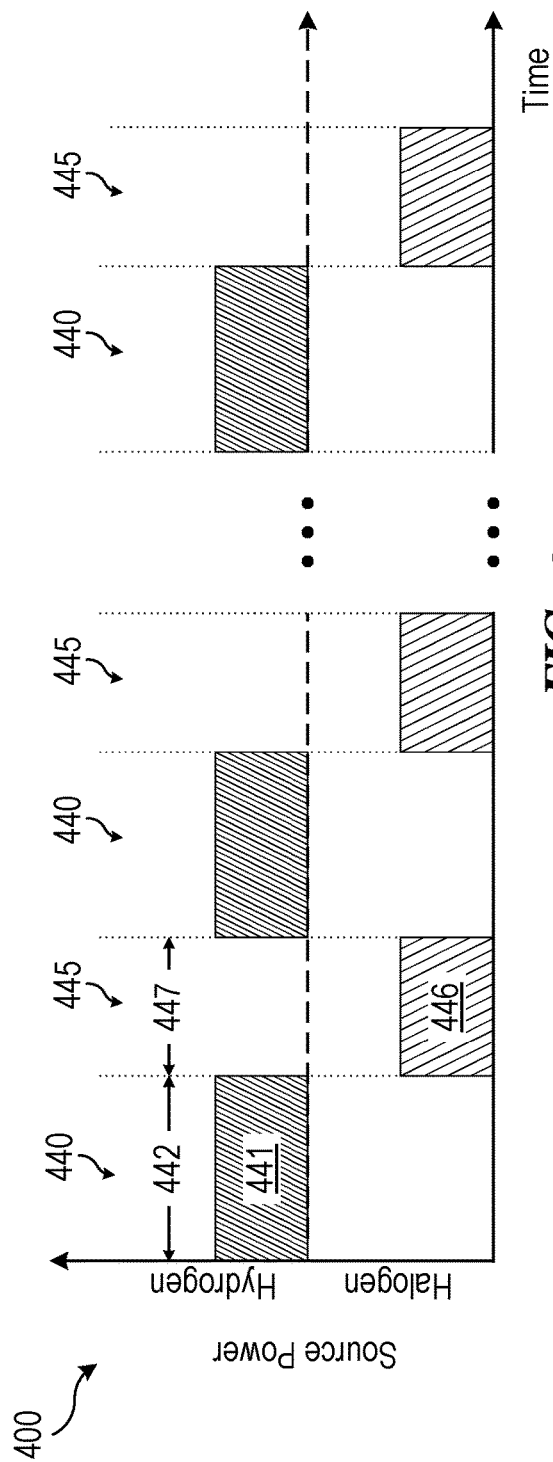
FIG. 4 illustrates a schematic timing diagram of an example method including a process of treating a substrate in accordance with an embodiment of the invention.

FIG. 4 illustrates a schematic timing diagram of an example method including a process of treating a substrate in accordance with an embodiment of the invention. The schematic timing diagram of FIG. 4 may be of a method including a process that is a specific implementation of other processes described herein such as the process of FIG. 1, for example.

Similarly labeled elements may be as previously described.

Referring to FIG. 4, a schematic timing diagram 400 includes alternating phases of a hydrogen-based plasma treatment phase 440 and a halogen-based plasma treatment phase 445. The hydrogen-based plasma treatment phase 440 includes a hydrogen-based plasma treatment which may be as previously described. The hydrogen-based plasma treatment phase 440 comprises a chemical modification pulse 441 representing a gas flow (e.g. a gas containing hydrogen-based species). The chemical modification pulse 441 includes a chemical modification pulse duration 442 that is less than or equal to the duration of the hydrogen-based plasma treatment phase 440.

In various embodiments, the chemical modification pulse 441 comprises source power applied to a plasma system to generate plasma. The chemical modification pulse 441 may be or include other applied power (e.g. bias power). For example, bias power may be direct current (DC) power (e.g. continuous, bipolar, etc.). In some embodiments, the chemical modification pulse 441 comprises power in the range of about 100 W to about 200 W applied to a plasma system. In one embodiment, the chemical modification pulse 441 comprises about power 500 W applied to a plasma system. However, the magnitude of applied power during the chemical modification pulse 441 may also be other values depending on the details of a specific application.

In various embodiments, the chemical modification pulse 441 comprises alternating current (AC) source power comprises radio frequency (RF) source power in some embodiments. In one embodiment, the chemical modification pulse 441 comprises high frequency (HF) RF source power. For example, the HF RF source power may be at a frequency of about 13.56 MHz. In another embodiment, the chemical modification pulse 441 comprises very high frequency (VHF) RF source power. In still another embodiment, chemical modification pulse 441 comprises ultra high frequency (UHF) RF source power. However, when the chemical modification pulse 441 comprises RF source power, other frequency ranges may also be used.

The chemical modification pulse duration 442 ranges from about 5 s to about 20 s in some embodiments. For example, the chemical modification pulse duration 442 may be about 8 s. However, the chemical modification pulse duration 442 may be greater than 20 s or less than 5 s for some applications.

The chemical modification pulse duration 442 indicates gas flow during the chemical modification pulse 441. During the chemical modification pulse 441, there may be a stabilization period during which no power is applied to the plasma system. For example, the stabilization period may be a few seconds. In some embodiments, the chemical modification pulse duration 442 comprises a stabilization period of about 3 s at the beginning of the pulse with RF source power being applied for at least 5 s thereafter. Other combinations of stabilization and applied power may also be utilized.

The halogen-based plasma treatment phase 445 includes a halogen-based plasma treatment which may be as previously described. The halogen-based plasma treatment phase 445 comprises an etching pulse 446 representing a gas flow (e.g. a gas containing halogen-based species). The gas provided during the etching pulse 446 is different that of the chemical modification pulse 441. The etching pulse 446 includes an etching pulse duration 447 that is less than or equal to the duration of the halogen-based plasma treatment phase 445. In some cases there may be a delay between the chemical modification pulse 441 and a subsequent etching pulse such as for purging purposes.

Similar to the chemical modification pulse 441, the etching pulse 446 may comprise source power and/or bias power applied to the plasma system to generate plasma for some or all of the halogen-based plasma treatment phase 445. The source power applied during the etching pulse 446 may be similar to the source power as previously described, such as being the range of about 100 W to about 200 W or being about 500 W. However, the source power applied during the etching pulse 446 may also have different settings such as power, frequency, etc. For example, the etching pulse 446 may comprise HF RF source power with a frequency of about 27 MHz. In other embodiments, the etching pulse 446 may comprise RF source power with frequencies in the ranges of very low frequency (VLF), low frequency (LF), middle frequency (MF), and others.

The etching pulse duration 447 ranges from about 5 s to about 20 s in some embodiments. For example, the etching pulse duration 447 may be about 8 s. However, the etching pulse duration 447 may be greater than 20 s or less than 5 s for some applications. There is no requirement that the chemical modification pulse duration 442 be the same as the etching pulse duration 447 and may depend on the specific gases used and on the details of a given application. As mentioned before, there may also be a delay (e.g. for purging purposes) between the etching pulse 446 and a subsequent chemical modification pulse.

Figure 5:
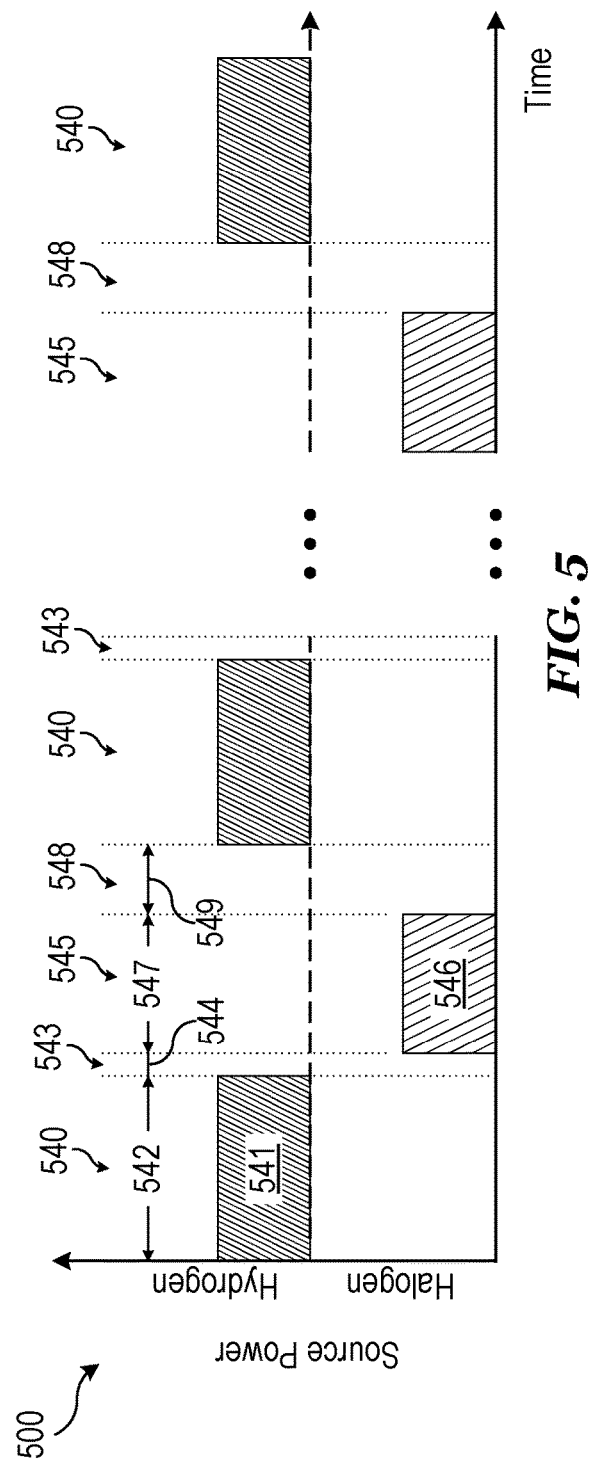
FIG. 5 illustrates another schematic timing diagram of an example method including a process of treating a substrate in accordance with an embodiment of the invention.

FIG. 5 illustrates another schematic timing diagram of an example method including a process of treating a substrate in accordance with an embodiment of the invention. The schematic timing diagram of FIG. 5 may be of a method including a process that is a specific implementation of other processes described herein such as the process of FIG. 1, for example. Similarly labeled elements may be as previously described.

Referring to FIG. 5, a schematic timing diagram 500 also includes alternating phases of a hydrogen-based plasma treatment phase 540 and a halogen-based plasma treatment phase 545. The schematic timing diagram 500 may be a specific implementation of the schematic timing diagram 400 of FIG. 4 when purging phases are included after one or both of the hydrogen-based plasma treatment phase and the halogen-based plasma treatment phase.

Specifically, an optional hydrogen-based chemistry purging phase 543 having a hydrogen-based chemistry purging duration 544 may be included after the hydrogen-based plasma treatment phase 540. Alternatively or additionally, an optional halogen-based chemistry purging phase 548 that has a halogen-based chemistry purging duration 549 may be included after the halogen-based plasma treatment phase 545. The optional hydrogen-based chemistry purging phase 543 may advantageously limit hydrogen interaction with etching by-products. Similarly, the optional halogen-based chemistry purging phase 548 may advantageously remove etching by-products and limit/prevent redeposition.

The purging phases may be symmetric (i.e. the hydrogen-based chemistry purging duration 544 is about equal to the halogen-based chemistry purging duration 549) or asymmetric depending on desired level of purging. In one embodiment, the hydrogen-based chemistry purging duration 544 is less than the halogen-based chemistry purging duration 549. In various embodiments, the hydrogen-based plasma treatment phase 540 is at least 10 s. The halogen-based chemistry purging duration 549 is also at least 10 s in various embodiments.

Figure 6:
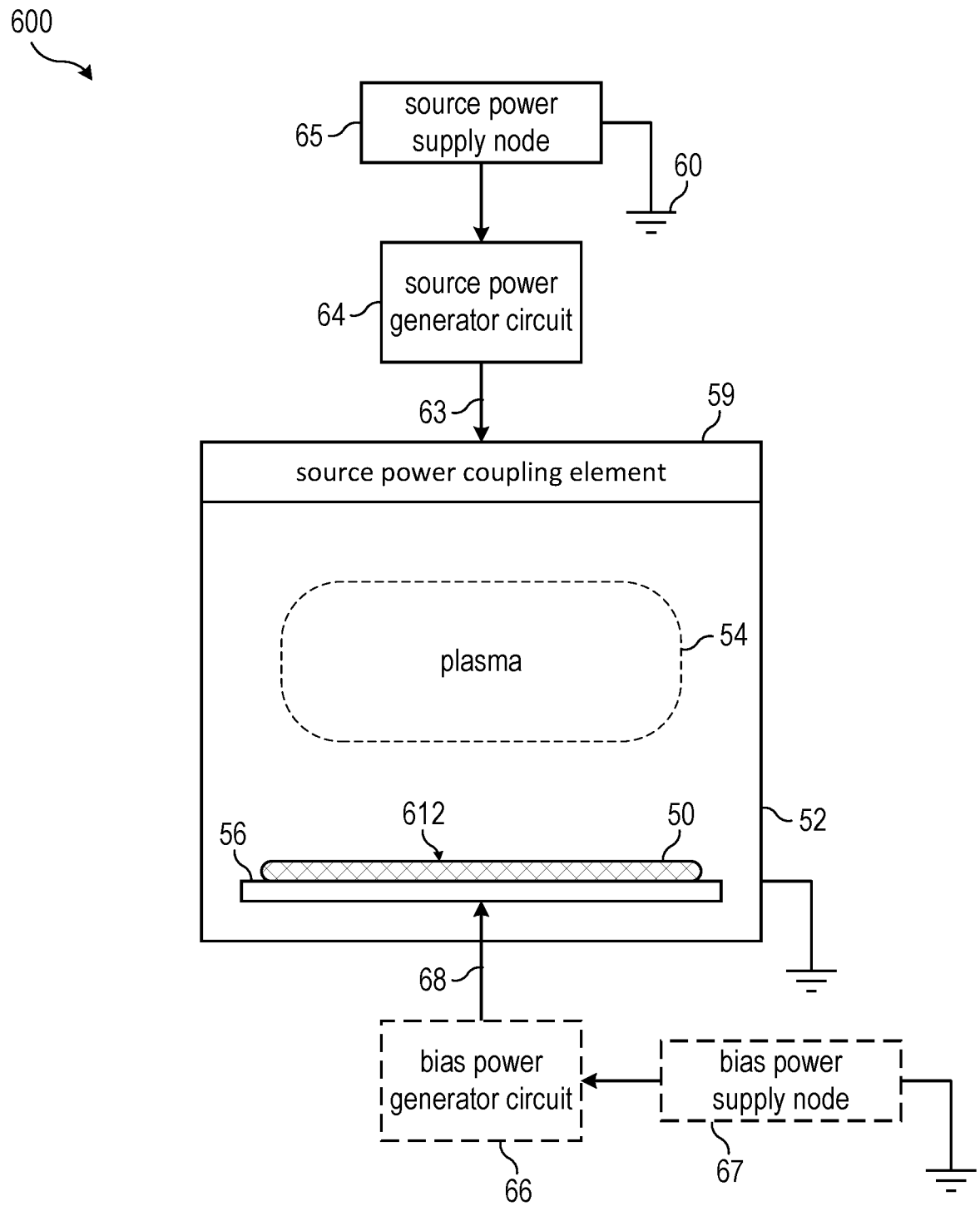
FIG. 6 illustrates a system for plasma processing in accordance with an embodiment of the invention.

FIG. 6 illustrates a system for plasma processing in accordance with an embodiment of the invention. The system of FIG. 6 may be used to perform any of the processes and methods as described herein, such as the processes of FIGS. 1-5 and/or the methods of FIGS. 8-10, for example. Similarly labeled elements may be as previously described.

Referring to FIG. 6, a system 600 for plasma processing includes a vacuum process chamber 52 and a source power coupling element 59. A substrate 50 is disposed in the vacuum process chamber 52. The vacuum process chamber 52 may also be referred to as a plasma chamber, processing chamber, chamber, etc. The substrate 50 may be any suitable material or combination of materials and be at any stage of processing. In various embodiments, the substrate 50 comprises a semiconductor material. The substrate 50 may also include various insulating and/or conducting materials. In various embodiments, the substrate 50 comprises a compound material and comprises a III-V material in some embodiments. For example, the substrate 50 may comprise one or more of InGaAs, GaAs, InP, as well as others.

The source power coupling element 59 is configured to generate plasma 54 within the vacuum process chamber 52 using source power 63 from a source power supply node 65. The plasma 54 is used to treat an exposed surface 612 of the substrate 50. Specifically, the plasma 54 may be used during the hydrogen-based plasma treatments and/or the halogen-based plasma treatments described herein. The plasma 54 may be any suitable type of plasma. In one embodiment, the plasma 54 is a surface wave plasma (SWP). Alternatively, the plasma 54 may be an inductively coupled plasma (ICP), a capacitively coupled plasma (CCP), and others. In FIG. 6, the plasma 54 represents both a hydrogen-based plasma and a halogen-based plasma depending on the phase of the process.

Gas provided to the vacuum process chamber 52 may influence the plasma composition and therefore be different during the two types of plasma treatment. For example, a gas comprising hydrogen-based chemistry ($H_2$) may be provided to the vacuum process chamber 52 during a hydrogen-based plasma treatment phase providing hydrogen-based radicals and/or hydrogen-based ions. Similarly, a gas comprising halogen-based chemistry (e.g. an etchant source gas such as $Cl_2$) may be provided into the vacuum process chamber 52 thereby providing the halogen-based radicals and/or halogen-based ions either directly or indirectly through formation within the plasma 54.

The source power supply node 65 is coupled to a ground 60 and also to the source power coupling element 59 through a source power generator circuit 64. In one embodiment, the source power generator circuit 64 provides AC power. For example, the AC power may be RF power of any suitable frequency (HF, VHF, UHF, MF, LF, VLF, etc.). The vacuum process chamber 52 may also be grounded (e.g. coupled to ground 60 or to a separate ground connection).

A substrate chuck 56 is included in the vacuum process chamber 52. The substrate chuck 56 is configured to support the substrate 50 which includes the exposed surface 612. For example, the exposed surface 612 may be positioned to interact with various species formed by the plasma 54. The substrate chuck 56 may be provided with bias power 68. For example, the substrate chuck 56 may optionally be coupled to a bias power supply node 67 through a bias power generator circuit 66. The bias power generator circuit 66 may provide DC-offset AC power, for example. The bias power supply node 67 may be also be grounded (e.g. coupled to ground 60 or to a separate ground connection).

Figure 7:
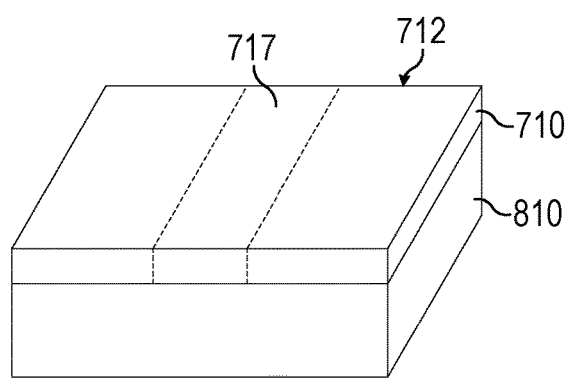
FIG. 7 illustrates an example process for forming a structure in accordance with an embodiment of the invention.
Figure 7:
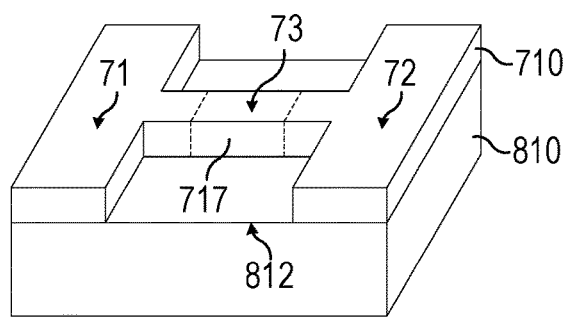
Figure 7:
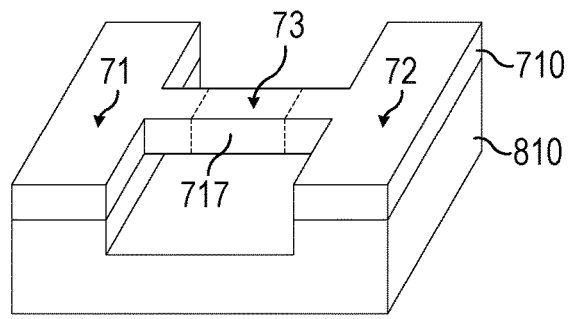
Figure 7:
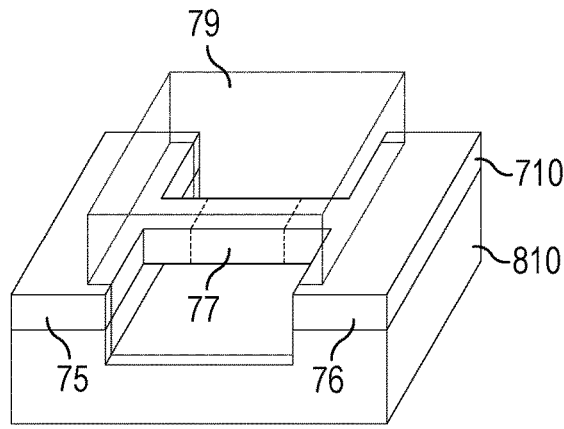

FIG. 7 illustrates an example process for forming a structure in accordance with an embodiment of the invention. The process for forming the structure of FIG. 7 may incorporate any of the processes, systems, and methods as described herein, such as the processes of FIGS. 1-5, the system of FIG. 6, and/or the methods of FIGS. 8-10. Similarly labeled elements may be as previously described.

Referring to FIG. 7, a first compound material 710 overlying a second compound material 810 is shown at an initial stage 701 of a process 700 for forming a structure. The first compound material 710 includes a first exposed surface 712 as shown. The second compound material 810 may be the entire substrate or may itself overly additional supporting material of the substrate.

The first compound material 710 and the second compound material 810 are different materials in various embodiments. For example, the first compound material 710 and the second compound material 810 may have different selectivity toward various etchants thereby facilitating selective etching processes. In some embodiments, the first compound material 710 InGaAs and is $In_{0.53}Ga_{0.47}As$ in one embodiment. In one embodiment, the second compound material 810 is InP.

The first compound material 710 may be a semiconducting material. For example, the first compound material 710 may be a doped semiconductor material and is a doped III-V material in some embodiments. In applications where the first compound material 710 is a doped semiconductor material, a doped region 717 may have a first doping type (e.g. p−) while the remaining regions of the first compound material 710 have an opposite second doping type (e.g. n+).

The first exposed surface 712 of the first compound material 710 is etched anisotropically using a dry-etching process (e.g. using a mask layer and the process of FIG. 2) resulting in a first post-etch stage 705. In the specific case of InGaAs and InP, a hydrogen-based plasma treatment phase and a halogen-based plasma treatment phase (e.g. containing Cl) may be cyclically applied to etch the InGaAs. Control over the amount of InGaAs removed may advantageously be high due to the quasi-self-limiting nature of the etching process. Consequently, the etch may or may not be selective to InGaAs; a tolerable amount of InP may be etched in some cases.

In the illustrated example, portions of the first compound material 710 are removed to form an H-structure having a first end region 71 and a second end region 72 that are joined by a crossbar 73. The removal of the portions of the first compound material 710 also exposed a second exposed surface 812 of the second compound material 810. At this point, the crossbar 73 of the first compound material 710 is exposed on three sides and includes the doped region 717. A gate electrode could then be formed over the crossbar 73 after the first post-etch stage 705 to form a tri-gate FinFET.

Alternatively, by incorporating another etching process, more complex non-planar III-V features may advantageously be formed. For example, horizontal etches (e.g. undercutting etches) such as the substantially isotropic etching process of FIG. 3 may be useful to form nanosheets, nanowires, GAA structures, gate etch-back structures, etc.

The second exposed surface 812 of the second compound material 810 is the etched isotropically using a dry-etching process resulting in a second post-etch stage 715. The etchant used to etch the second compound material 810 may be highly selective to the second compound material 810 (e.g. the first compound material 710 may be used as a mask). Additionally, the mask layer may also be left on to provide further protection of the first compound material 710 if desired.

In the specific case of InGaAs and InP, a hydrogen-based plasma treatment phase and a plasma treatment phase (e.g. containing $CH_4$) may be cyclically applied to selectively etch the InP. The $CH_4$ may etch the InP, but not appreciably etch the InGaAs. In some cases the $CH_4$ may advantageously protect exposed regions of the InGaAs (e.g. through a monolayer of film growth).

As shown, the second compound material 810 under the crossbar 73 is etched so that the crossbar 73 is suspended with all four sides exposed. It should be noted that, although not shown for the sake of simplicity, the second compound material 810 under the first end region 71 and the second end region 72 may also be partially etched creating a slight overhang of the first compound material 710.

At this point a gate material may be formed around the crossbar 73 and patterned to create a gate electrode 79 as shown in device structure 720. The doped region 717 may now function as a channel 77 for a GAA FET device with the gate electrode 79 completely surrounding the channel 77 on four sides. The first end region 71 may then function as a source/drain region 75 while the second end region functions as a drain/source region 76. Of course, other complicated structures other than GAA FETs may also be formed using the methods and processes described herein.

Process 700 may advantageously produce complex 3D structures using compound materials such as III-V materials. The process 700 may have the advantage of only etching with dry-etching processes which may enable process integration (e.g. HVM). Further, III-V materials may be difficult to process using conventional techniques. Process 700 as well as the other methods and processes described herein may advantageously enable realization of smaller process nodes (e.g. 3 nm) due to the ability to use III-V materials in devices.

FIG. 8 illustrates an example method including a process of treating a substrate in accordance with an embodiment of the invention. The method of FIG. 8 may be performed using embodiment processes and embodiment systems as described herein. For example, the method of FIG. 8 may be combined with any of the embodiments of FIGS. 1-7. Arrows in FIG. 8 are intended to indicate order of the steps, but are not intended to be limiting. The below method steps may be performed in any suitable order as may be apparent to a person of skill in the art.

Referring to FIG. 8, step 801 of a method 800 that includes a process of treating a substrate is to receive a substrate in a vacuum process chamber. The substrate comprises a III-V film layer disposed on the substrate. The III-V film layer comprises an exposed surface, an interior portion underlying the exposed surface, and one or more of the following: Al, Ga, In, N, P, As, Sb, Si, or Ge.

Step 802 is to alter the chemical composition of the exposed surface and a fraction of the interior portion of the III-V film layer to form an altered portion of the III-V film layer using a hydrogen-based plasma treatment. Step 803 includes removing the altered portion of the III-V film layer using a chlorine-based plasma treatment.

The method 800 may be performed cyclically. That is, after step 803, the method 800 may optionally (and repeatedly) proceed back to step 801, indicated as step 804. For example, the method 800 may be cyclically performed until a desired amount of the III-V film layer has been removed.

FIG. 9 illustrates another example method including a process of treating a substrate in accordance with an embodiment of the invention. The method of FIG. 9 may be performed using embodiment processes and embodiment systems as described herein. For example, the method of FIG. 9 may be combined with any of the embodiments of FIGS. 1-8. Arrows in FIG. 9 are intended to indicate order of the steps, but are not intended to be limiting. The below method steps may be performed in any suitable order as may be apparent to a person of skill in the art.

Referring to FIG. 9, a step 901 of a method 900 that includes a process of treating a substrate is to receive a substrate in a vacuum process chamber. The substrate comprises a III-V film layer disposed on the substrate. The III-V film layer comprises an exposed surface, an interior portion underlying the exposed surface, and one or more of the following: Al, Ga, In, N, P, As, Sb, Si, or Ge.

Step 902 includes treating the exposed surface using a chlorine-based plasma pre-treatment to form a passivation layer on the exposed surface. Step 903 is to treat the substrate with a hydrogen-based plasma treatment to form a hydrogen interface layer between the passivation layer and the interior portion. The passivation layer is then removed in step 904 using a chlorine-based plasma treatment to expose the interior portion.

The method 900 may be performed cyclically. That is, after step 904, the method 900 may optionally (and repeatedly) proceed back to step 901 via step 905. For example, the method 900 may be cyclically performed until a desired amount of the III-V film layer has been removed.

FIG. 10 illustrates still another example method including a process of treating a substrate in accordance with an embodiment of the invention. The method of FIG. 10 may be performed using embodiment processes and embodiment systems as described herein. For example, the method of FIG. 10 may be combined with any of the embodiments of FIGS. 1-9. Arrows in FIG. 10 are intended to indicate order of the steps, but are not intended to be limiting. The below method steps may be performed in any suitable order as may be apparent to a person of skill in the art.

Referring to FIG. 10, step 1001 of a method 1000 including a process of treating a substrate is to receive a substrate in a vacuum process chamber. The substrate comprises a III-V film layer disposed on the substrate. The III-V film layer comprises an exposed surface, an interior portion underlying the exposed surface, and one or more of the following: Al, Ga, In, N, P, As, Sb, Si, or Ge.

Step 1002 is to alter the chemical composition of the exposed surface and a fraction of the interior portion of the III-V film layer to form an altered portion of the III-V film layer using a hydrogen-based plasma treatment. The altered portion of the III-V film layer is removed in step 1003 using a halogen-based plasma treatment. Step 1004 includes purging the vacuum process chamber of halogen-based chemistry from the halogen-based plasma treatment.

The method 1000 may be performed cyclically. That is, after step 1004, the method 1000 may optionally (and repeatedly) proceed back to step 1001, shown as step 1005. For example, the method 1000 may be cyclically performed until a desired amount of the III-V film layer has been removed.

Example embodiments of the invention are summarized here. Other embodiments can also be understood from the entirety of the specification as well as the claims filed herein.

Example 1. A method for treating a substrate, including: receiving a substrate in a vacuum process chamber, the substrate including a III-V film layer disposed on the substrate, the III-V film layer including an exposed surface, an interior portion underlying the exposed surface, and one or more of the following: Al, Ga, In, N, P, As, Sb, Si, or Ge; altering the chemical composition of the exposed surface and a fraction of the interior portion of the III-V film layer to form an altered portion of the III-V film layer using a hydrogen-based plasma treatment; removing the altered portion of the III-V film layer using a chlorine-based plasma treatment; and repeating the altering and removing of the III-V film layer until a predetermined amount of the III-V film layer is removed from the substrate.

Example 2. The method of example 1, where removing the altered portion includes a substantially anisotropic etch of the altered portion of the III-V film layer.

Example 3. The method of example 2, where the chlorine-based plasma treatment includes a pressure less than about 30 mTorr.

Example 4. The method of example 1, where removing the altered portion includes a substantially isotropic etch of the altered portion of the III-V film layer.

Example 5. The method of example 4, where the chlorine-based plasma treatment includes a pressure greater than about 100 mTorr.

Example 6. The method of one of examples 1 to 5, where the III-V film layer includes Ga and As.

Example 7. The method of example 6, where the III-V film layer is InGaAs.

Example 8. The method of one of examples 1 to 7, further including: after removing the altered portion and before repeating the altering and removing, purging the vacuum process chamber of chlorine-based chemistry from the chlorine-based plasma treatment.

Example 9. The method of example 8, further including: after altering the chemical composition of the exposed surface and before removing the altered portion, purging the vacuum process chamber of hydrogen-based chemistry from the hydrogen-based plasma treatment, where a duration of purging the vacuum process chamber of the hydrogen-based chemistry is less than a duration of purging the vacuum process chamber of the chlorine-based chemistry.

Example 10. The method of one of examples 1 to 10, where the altered portion of the III-V film layer is less than about 5 nm.

Example 11. A method for treating a substrate, including: receiving a substrate in a vacuum process chamber, the substrate including a III-V film layer disposed on the substrate, the III-V film layer including an exposed surface, an interior portion underlying the exposed surface, and one or more of the following: Al, Ga, In, N, P, As, Sb, Si, or Ge; treating the exposed surface using a chlorine-based plasma pre-treatment to form a passivation layer on the exposed surface; treating the substrate with a hydrogen-based plasma treatment to form a hydrogen interface layer between the passivation layer and the interior portion; removing the passivation layer and the hydrogen interface layer, using a chlorine-based plasma treatment, to expose the interior portion; and repeating the treating of the exposed surface, the treating of the substrate, and the removing of the passivation layer and the hydrogen interface layer until a predetermined amount of the III-V film layer is removed from the substrate.

Example 12. The method of example 11, where the chlorine-based plasma treatment includes a pressure greater than about 100 mTorr.

Example 13. The method of one of examples 11 and 12, where the III-V film layer includes Ga and As.

Example 14. The method of example 13, where the III-V film layer is InGaAs.

Example 15. The method of one of examples 11 to 14, where: no bias power is applied to the substrate during the chlorine-based plasma pre-treatment and during the hydrogen-based plasma treatment; and both the chlorine-based plasma pre-treatment and the hydrogen-based plasma treatment include a pressure greater than about 100 mTorr.

Example 16. The method of example 15, further including: applying a bias power between about 100 W and about 200 W to the substrate during the chlorine-based plasma treatment; and where the chlorine-based plasma treatment includes a pressure greater than about 100 mTorr.

Example 17. A method for treating a substrate, including: receiving a substrate in a vacuum process chamber, the substrate including a III-V film layer disposed on the substrate, the III-V film layer including an exposed surface, an interior portion underlying the exposed surface, and one or more of the following: Al, Ga, In, N, P, As, Sb, Si, or Ge; altering the chemical composition of the exposed surface and a fraction of the interior portion of the III-V film layer to form an altered portion of the III-V film layer using a hydrogen-based plasma treatment; removing the altered portion of the III-V film layer using a halogen-based plasma treatment; purging the vacuum process chamber of halogen-based chemistry from the halogen-based plasma treatment; and repeating the altering of the chemical composition of the exposed surface, the removing of the altered portion of the III-V film layer, and the purging the vacuum process chamber of the halogen-based chemistry until a predetermined amount of the III-V film layer is removed from the substrate.

Example 18. The method of example 17, where the III-V film layer includes Ga and As.

Example 19. The method of one of examples 17 and 18, where the halogen-based plasma treatment is a chlorine-based plasma treatment and the halogen-based chemistry is chlorine-based chemistry.

Example 20. The method of one of examples 17 to 19, further including: after altering the chemical composition of the exposed surface and before removing the altered portion, purging the vacuum process chamber of hydrogen-based chemistry from the hydrogen-based plasma treatment.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for treating a substrate, comprising:
   receiving a substrate in a vacuum process chamber, the substrate comprising a III-V film layer disposed on the substrate, the III-V film layer comprising
   an exposed surface,
   an interior portion underlying the exposed surface, and
   one or more of the following: Al, Ga, In, N, P, As, Sb, Si, or Ge;
   altering the chemical composition of the exposed surface and a fraction of the interior portion of the III-V film layer to form an altered portion of the III-V film layer using a hydrogen-based plasma treatment;
   removing the altered portion of the III-V film layer using a chlorine-based plasma treatment; and
   repeating the altering and removing of the III-V film layer until a predetermined amount of the III-V film layer is removed from the substrate.

2. The method of claim 1, wherein removing the altered portion comprises a substantially anisotropic etch of the altered portion of the III-V film layer.

3. The method of claim 2, wherein the chlorine-based plasma treatment comprises a pressure less than about 30 mTorr.

4. The method of claim 1, wherein removing the altered portion comprises a substantially isotropic etch of the altered portion of the III-V film layer.

5. The method of claim 4, wherein the chlorine-based plasma treatment comprises a pressure greater than about 100 mTorr.

6. The method of claim 1, wherein the III-V film layer comprises Ga and As.

7. The method of claim 6, wherein the III-V film layer is InGaAs.

8. The method of claim 1, further comprising:
   after removing the altered portion and before repeating the altering and removing, purging the vacuum process chamber of chlorine-based chemistry from the chlorine-based plasma treatment.

9. The method of claim 8, further comprising:
   after altering the chemical composition of the exposed surface and before removing the altered portion, purging the vacuum process chamber of hydrogen-based chemistry from the hydrogen-based plasma treatment, wherein a duration of purging the vacuum process chamber of the hydrogen-based chemistry is less than a duration of purging the vacuum process chamber of the chlorine-based chemistry.

10. The method of claim 1, wherein the altered portion of the III-V film layer is less than about 5 nm.

11. A method for treating a substrate, comprising:
    receiving a substrate in a vacuum process chamber, the substrate comprising a III-V film layer disposed on the substrate, the III-V film layer comprising
    an exposed surface,
    an interior portion underlying the exposed surface, and
    one or more of the following: Al, Ga, In, N, P, As, Sb, Si, or Ge;
    treating the exposed surface using a chlorine-based plasma pre-treatment to form a passivation layer on the exposed surface;
    treating the substrate with a hydrogen-based plasma treatment to form a hydrogen interface layer between the passivation layer and the interior portion;
    removing the passivation layer and the hydrogen interface layer, using a chlorine-based plasma treatment, to expose the interior portion; and
    repeating the treating of the exposed surface, the treating of the substrate, and the removing of the passivation layer and the hydrogen interface layer until a predetermined amount of the III-V film layer is removed from the substrate.

12. The method of claim 11, wherein the chlorine-based plasma treatment comprises a pressure greater than about 100 mTorr.

13. The method of claim 11, wherein the III-V film layer comprises Ga and As.

14. The method of claim 13, wherein the III-V film layer is InGaAs.

15. The method of claim 11, wherein:
no bias power is applied to the substrate during the chlorine-based plasma pre-treatment and during the hydrogen-based plasma treatment.

16. The method of claim 15, wherein both the chlorine-based plasma pre-treatment and the hydrogen-based plasma treatment comprise a pressure greater than about 100 mTorr.

17. The method of claim 16, further comprising:
applying a bias power between about 100 W and about 200 W to the substrate during the chlorine-based plasma treatment.

18. The method of claim 17, wherein the chlorine-based plasma treatment comprises a pressure greater than about 100 mTorr.

19. A method for treating a substrate, comprising:
receiving a substrate in a vacuum process chamber, the substrate comprising a III-V film layer disposed on the substrate, the III-V film layer comprising
an exposed surface,
an interior portion underlying the exposed surface, and
one or more of the following: Al, Ga, In, N, P, As, Sb, Si, or Ge;
altering the chemical composition of the exposed surface and a fraction of the interior portion of the III-V film layer to form an altered portion of the III-V film layer using a hydrogen-based plasma treatment;
removing the altered portion of the III-V film layer using a halogen-based plasma treatment;
purging the vacuum process chamber of halogen-based chemistry from the halogen-based plasma treatment; and
repeating the altering of the chemical composition of the exposed surface, the removing of the altered portion of the III-V film layer, and the purging the vacuum process chamber of the halogen-based chemistry until a predetermined amount of the III-V film layer is removed from the substrate.

20. The method of claim 19, wherein the III-V film layer comprises Ga and As.

21. The method of claim 19, wherein the halogen-based plasma treatment is a chlorine-based plasma treatment and the halogen-based chemistry is chlorine-based chemistry.

22. The method of claim 19, further comprising:
after altering the chemical composition of the exposed surface and before removing the altered portion, purging the vacuum process chamber of hydrogen-based chemistry from the hydrogen-based plasma treatment.

* * * * *